United States Patent [19]

Cantrell

[11] 4,187,504
[45] Feb. 5, 1980

[54] FAULT MONITORING AND INDICATOR SYSTEM

[75] Inventor: Henry L. Cantrell, Urbana, Ohio

[73] Assignee: Midland-Ross Corporation, Cleveland, Ohio

[21] Appl. No.: 874,771

[22] Filed: Feb. 3, 1978

[51] Int. Cl.$^2$ ............................................. G08B 21/00
[52] U.S. Cl. ............................... 340/652; 246/34 CT; 324/51; 331/64; 340/48
[58] Field of Search ............... 340/48, 47, 652, 384 E; 246/34 CT, 28 F, 169 R; 324/51; 331/64

[56] References Cited

U.S. PATENT DOCUMENTS

| 2,707,778 | 5/1955 | Neiswinter | 340/164 R |
| 2,735,089 | 2/1956 | Pickell | 340/650 |
| 2,991,397 | 7/1961 | Place | 324/51 X |
| 3,671,809 | 6/1972 | Ryan et al. | 324/51 X |
| 3,688,293 | 8/1972 | Sullivan | 340/384 E X |

*Primary Examiner*—John W. Caldwell, Sr.
*Assistant Examiner*—Daniel Myer
*Attorney, Agent, or Firm*—Biebel, French & Nauman

[57] ABSTRACT

A continuity monitor and indicator circuit for monitoring the continuity of a segment of a pair of control conductors along which a control current flows includes capacitors at each end of the segment being monitored, which capacitors are connected to bridge the conductors and provide an a.c. electrical path between the conductors. A transformer has its secondary winding connected in series with one of the control conductors in the segment and an oscillator is connected to the primary winding of the transformer. The oscillator arrangement is such that it will provide an output signal when the closed a.c. electrical loop formed by the secondary winding of the transformer, the control conductor segment, and the bridging capacitors is broken. A detector is responsive to the oscillator output to detect such output and supply a detector output to a delay means which, in turn, provides an alarm output after receipt of the detector output for a predetermined period of time. An indicator means, including a bidirectional magnetic latch, provides an alarm indication in response to the alarm output from the delay means.

7 Claims, 4 Drawing Figures

FAULT MONITORING AND INDICATOR SYSTEM

BACKGROUND OF THE INVENTION

The present invention relates to electrical monitoring devices, and more particularly, to a device for monitoring the electrical continuity of a pair of electrical control conductors which extend along a plurality of subway cars and which provide an electrical control signal to each of the cars.

Various types of rail transit cars have individual propulsion and braking systems for each car making up the train. Such cars may, therefore, be operated independently or grouped together in trains. It is necessary to provide a control circuit extending along the length of a train of such cars so that the engineer at the front of the train can control operation of the braking and propulsion systems in each of the cars simultaneously. One system which has been developed for providing such control uses a pair of electrical conductors which extend the entire length of each transit car. Connectors are provided at both ends of each car such that the control conductors may be connected to those of the adjoining cars. A current source is provided at the front of the train for operation by the engineer and a bridging electrical conductor is then placed across the control conductors at the end of the last car in the train. Transducers in each car monitor the current flow through the conductors. A nominal current value, such as 500 milliamps, is applied by the current source to the control conductors. When it is desired to accelerate the train, the current is increased above 500 milliamps; conversely, when braking is desired, the current is reduced below the 500 milliamp level. This control system is clearly essential to operation of the transit cars.

Since all of the conductors are connected in series, if a fault should occur in any conductor or connector, the entire trail will be disabled. The isolation of temporary faults or opens in the control conductor loop presents extremely troublesome problems since after the problem corrects itself, it is often extremely difficult to isolate the cause to a single car. Such momentary faults may be of a recurring nature with the result that the operation of the train will become extremely undependable. It will, therefore, be necessary to remove the entire train from service and spend an excessive amount of time in locating the car in which the intermittent faults occurs.

It is seen, therefore, that a circuit is needed for monitoring operation of the control conductor system and for detecting the occurrence of a fault in the system even if such fault should occur only intermittently and for determining in which of the individual cars the fault occurs. Further, a fault indication should be provided and maintained, even if all power is removed from the system.

SUMMARY OF THE INVENTION

A continuity monitor indicator circuit for monitoring the continuity of a segment of a pair of control conductors along which a control current flows includes a transformer having its secondary winding connected in series with one of the control conductors in the segment. Capacitor means at each end of the segment of the control conductors bridge the conductors and provide an a.c. electrical path therebetween. An oscillator means having an oscillator output includes a tank circuit connected to the primary winding of the transformer. The oscillator output is in a first oscillatory state when a closed a.c. electrical loop is provided by the secondary winding of the transformer, the control conductor segment, and the bridging capacitor means. The oscillator output is in a second oscillatory state when no such closed a.c. electrical loop is formed. A detector means is responsive to the oscillator output and detects when the second oscillatory state is provided at the oscillator output. The detector means provides a detector output is response to this second oscillatory state. A delay means is responsive to the detector means for providing an alarm output upon receipt for a predetermined time of the detector output. Indicator means is responsive to the alarm output for providing an alarm indication whereby interruption in the continuity of the closed a.c. electrical loop is detected and an alarm indication provided in response thereto.

The tank circuit may be such that it is detuned when the closed a.c. electrical loop is formed such that the oscillator means does not provide an oscillating signal on the oscillating output is its first oscillatory state. The oscillator state. The oscillator means in a second oscillatory state will provide an oscillating signal on its oscillator output when the closed a.c. electrical loop is broken.

The alarm means may comprise a bidirectional, magnetically actuatable, visual alarm having an actuation coil for receiving current, the direction of which determines the alarm indication state of the alarm means. The continuity monitor and indicator circuit may be used advantageously in a railroad train in which control conductors extend through a plurality of railroad cars in the train with the conductors in each car coupled to conductor in adjacent cars through connectors. Only a single capacitor is placed in each railroad car bridging the connectors at a first end of each car. Thus the closed a.c. electrical loop includes connectors providing connection of the control conductors to an adjacent railroad car.

Accordingly, it is an object of the present invention to provide a continuity monitor and indicator circuit for monitoring the continuity of a segment of a pair of control conductors along which a control current flows without affecting the flow of such control current; to provide such a circuit which is coupled to one of the conductors in the segment by means of a transformer; and to provide such a circuit in which the transformer is connected to the tank circuit of an oscillator.

Other objects and advantages of the present invention will become apparent from the following description, the accompanying drawings and the appended claims.

DETAILED DESCRIPTION OF THE PREFERRED EMBODIMENT

The present invention relates to a circuit for monitoring the continuity of a segment of a pair of control conductors in a control circuit and for providing an indication of the continuity of such segment. Operation of the control circuit is left unaffected by the monitoring operation. One control circuit of the type to be monitored is used on rapid transit cars which have individual propulsion and braking systems in each car making up a train. It is necessary in a train made up of such cars to provide for simultaneous braking and acceleration of each car in the train and, therefore, a control signal must necessarily be provided to each car.

Figure 1:
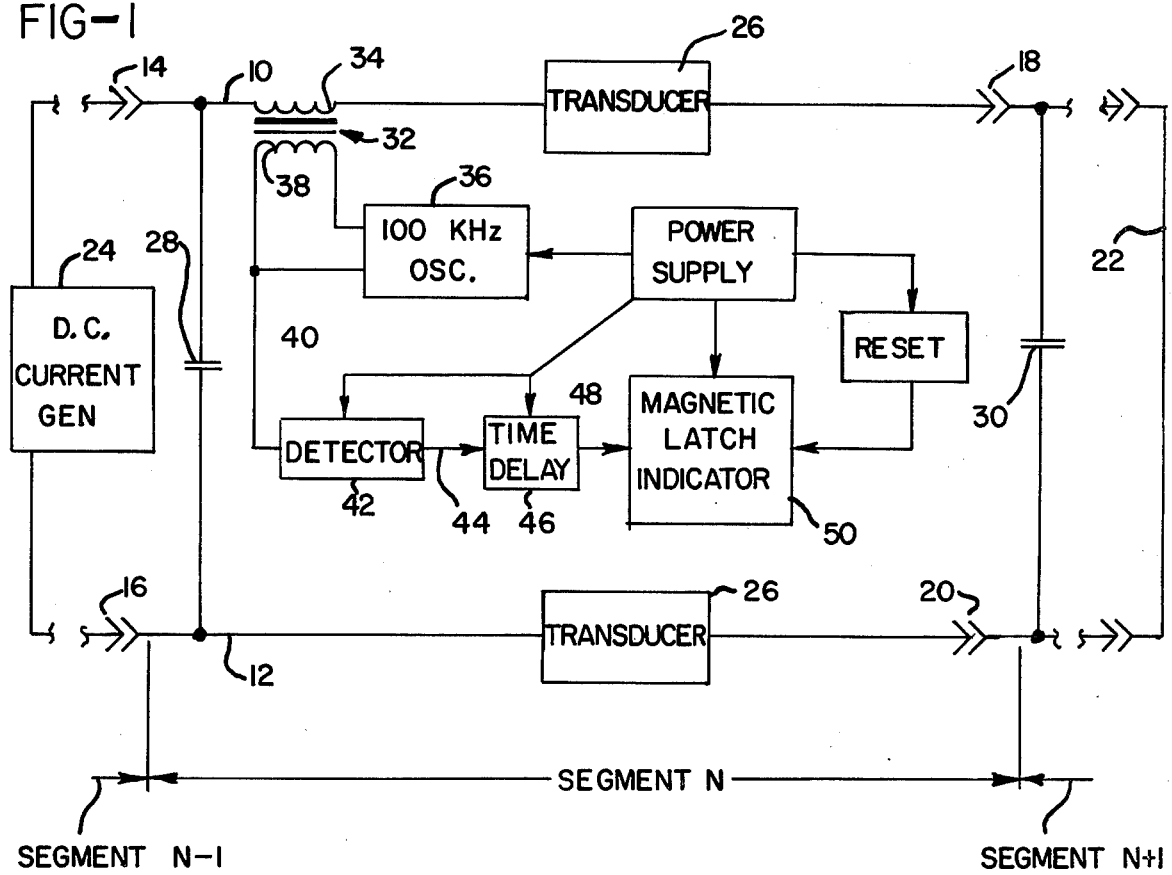
FIG. 1 is a schematic illustration of the circuit of the present invention connected to monitor a segment of a control conductor circuit.

As shown in FIG. 1, a control system incorporates control conductors 10 and 12 which are made up of N+1 segments, each such segment corresponding to the path of the conductors through an associated transit car. Although FIG. 1 shows a continuity monitor and indicator circuit for only segment N, it should be understood that such a circuit will be provided for each segment of the control conductors so that when a fault in the conductors occurs, the fault may be isolated immediately to a single segment of the control conductors. The car which includes this segment may then be taken out of service for repair and the balance of the cars in the train can continue to operate in normal fashion.

Connectors 14 and 16 connect the segment of conductors 10 and 12 to the preceeding N−1 segment and connectors 18 and 20 connect conductors 10 and 12 to the N+1 segment. A bridging electrical conductor 22 is provided across the control conductors 10 and 12 at the rear of the train.

A variable d.c. current generator 24 is provided at the front of the train and is operated by the engineer to control propulsion and braking of all of the cars in the train. Braking and propulsion by the appropriate systems in the cars will occur in proportion to the amount of deviation of the current in the control conductors 10 and 12 from a predetermined current level. Current greater than this predetermined level, typically 500 milliamps, will indicate that the cars are to accelerate, while current below this level will indicate that braking should be undertaken. Each car will have one or more transducers 26 in the control conductor lines to monitor the current level through the conductors and provide corresponding control signals to the braking and propulsion systems.

Capacitor means includes capacitors 28 and 30 which are positioned at each end of the segment of control conductors, bridging the conductors. The capacitors provide an a.c. electrical path between conductor 10 and 12. Transformer 32 has its secondary winding 34 connected in series with control conductors 10 in the segment N. An oscillator means includes oscillator 36 having a tank circuit connected to the primary winding 38 of transformer 32. The tank circuit of oscillator 36 is such that the oscillator output on line 40 is in a first oscillatory state when a closed a.c. electrical loop is provided by the secondary winding 38 of transformer 32, the control conductor segment including conductors 10 and 12, and the bridging capacitor means including capacitors 28 and 30. The oscillator output 40 is in a second oscillatory state when no such closed a.c. electrical loop is formed.

Detector circuit 42 is responsive to the oscillator output on line 40 for detecting when the second oscillatory state is provided at the output 40 and for providing a detector output on line 44 in response thereto. Delay means 46 is responsive to the detector means for providing an alarm output on line 48 upon receipt of a detector output for a predetermined period of time. An indicator means, including magnetic latch indicator 50, is responsive to the alarm output on line 48 for providing an alarm indication. Interruption in the continuity of the closed a.c. electrical loop formed by control conductors 10 and 12, capacitors 28 and 30, and transformer secondary 34 will therefore be detected and an alarm indication provided in response thereto.

Figure 2:
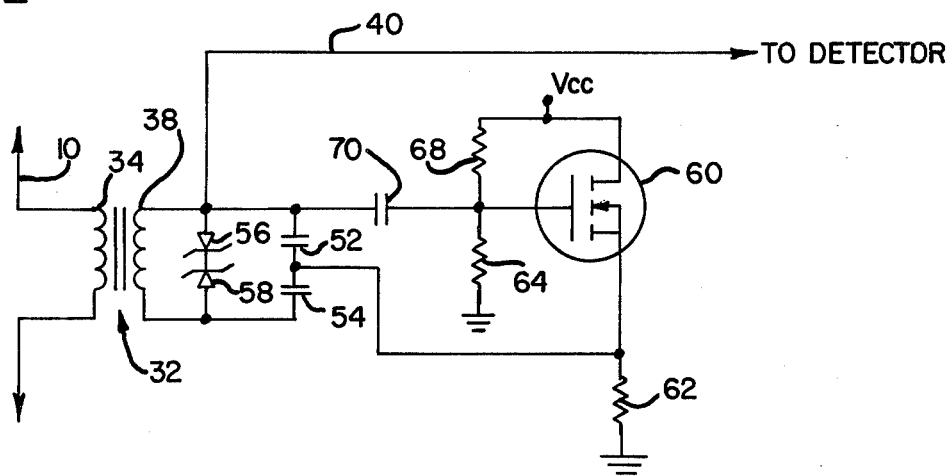
FIG. 2 is a schematic illustration of the oscillator circuit of the present invention.

Reference is now made to FIG. 2 which illustrates an oscillator circuit which may be used in the present invention. The secondary winding 34 of transformer 32 is connected in series with the control conductor 10. The primary winding 38 is connected in parallel with capacitors 52 and 54 and forms the tank circuit of the oscillator in combination therewith. Zener diodes 56 and 58 prevent excessive voltage from being transformed into the tank circuit, should a sudden current surge occur in the control conductor 10. Field effect transistor 60, resistors 62, 64 and 68, and capacitor 70, form the remainder of the oscillator circuit.

Capacitors 28 and 30 (FIG. 1) in conjunction with the control conductors 10 and 12 form a low impedance a.c. loop which includes the secondary winding 34 of transformer 32. This low impedance is reflected into the transformer primary winding 38 by the turns ratio of the transformer, which is on the order of 16–12 to 1. This low impedance loads down the oscillator circuit and prevents oscillation.

When the a.c. loop including the control conductors 10 and 12 experiences a discontinuity, the transformer secondary winding 34 experiences a high impedance which is reflected into the primary winding 38 of the transformer. This unloads the oscillator circuit and allows the resonant tank circuit, then consisting of the primary winding 38 and capacitors 52 and 54, to oscillate at a relatively high frequency—typically 100 KHz to 150 KHz. The oscillator 36 therefore is in a first oscillatory state in which it does not provide an oscillating signal on its oscillator output 40 when the closed a.c. electrical loop is formed. The oscillator output 40 receives an oscillating signal when the oscillator means is in its second oscillatory state which occurs when the closed a.c. electrical loop is broken. It should be appreciated, however, that this arrangement could be reversed—i.e., the oscillator designed to provide an oscillating output signal when the closed a.c. electrical loop is formed and no such oscillating signal when the loop is broken.

Figure 3:
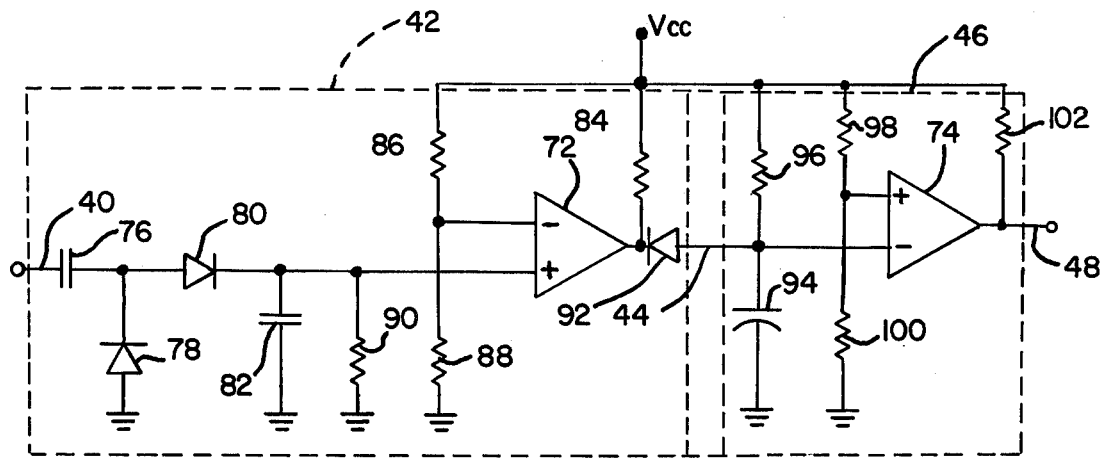
FIG. 3 is a schematic illustration of the detector and time delay circuits of the present invention.

FIG. 3 illustrates the detector circuit 42 and time delay circuit 46 in greater detail. These circuits use comparators 72 and 74 of the type which provide a high signal at the comparator output whenever the plus input is greater than the minus input. When the relative magnitudes of the inputs are reversed, the comparator outputs will go low. The input signal on line 40 to detector 42 is coupled through capacitor 76 and rectified by diodes 78 and 80. This signal is then smoothed by capacitor 82. Comparator 72, having resistor 84 at its output, compares a reference potential, applied to its minus input by resistors 86 and 88, with the input level applied across resistor 90. When the oscillator provides an oscillating signal on its output 40, indicating discontinuity in the a.c. electrical loop, a sufficient signal will be applied to the plus input to the comparator 72 such that its output will go high. Previously, the comparator 72 will have had a low output with the result that line 44 will have been grounded through diode 92. When the output of comparator 72 goes high, indicating an output from the oscillator 36, diode 92 will become reverse biased and line 44 will no longer be clamped to ground potential.

Time delay circuit 46 is provided to insure that the detector 42 has detected an actual discontinuity in the closed a.c. electrical loop. It may be that in some control system operations, the continuity in the control conductors will be momentarily interrupted. The delay provided by circuit 46 will be set such that only actual discontinuities are detected. It should be understood that some applications of the present invention may not require such a delay arrangement, however.

When the detector 42 unclamps the line 44 from ground potential, indicating the detection of a discontinuity and the resulting change in the oscillatory state of oscillator 36, capacitor 94, which has previously been maintained in an uncharged state, will begin to charge through resistor 96. Comparator 74, having previously received a reference potential on its plus input through the voltage divider consisting of resistors 98 and 100, will have previously provided a high signal on output 48 via resistor 102. When the capacitor 94 charges through resistance 96 to level such that the minus input of comparator 74 exceeds the reference supplied by resistors 98 and 100, the comparator output on line 48 will go low, indicating the detection of a discontinuity which exceeds the predetermined time period set by the delay circuit 46. This time period is determined by the RC time constant of resistor 96 and capacitor 94, as well as the reference potential level supplied by resistors 98 and 100.

Figure 4:
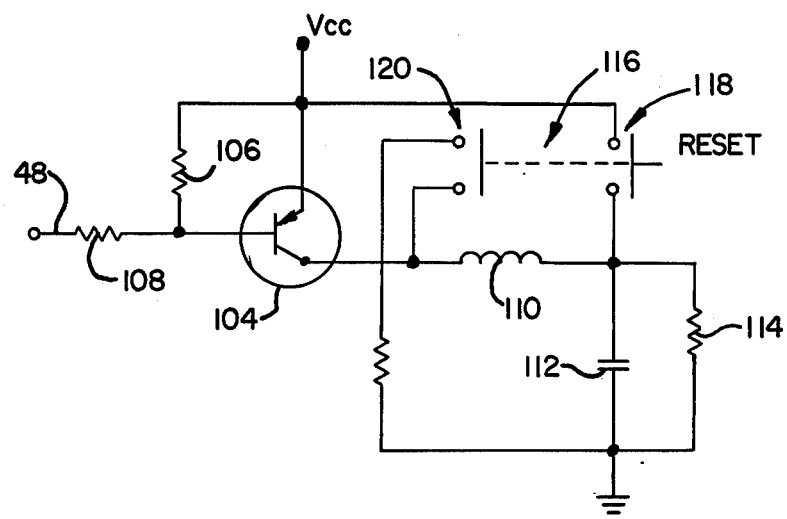
FIG. 4 is a schematic illustration of the magnetic latch indicator circuit of the present invention.

The magnetic latch indicator circuit used in the present invention is shown in FIG. 4. Transistor 104 will normally be maintained in an OFF switching state since its base potential will be biased high through resistor 106. When, however, line 48 goes low, the base potential will drop through the voltage divider consisting of resistor 106 and resistor 108 and, therefore, the transistor 104 will be switched ON. When this occurs, the transistor 104 will apply power to the coil 110 of a bidirectional magnetic latch mechanism. When the coil 110 receives current from transistor 104, it will produce a field which will move an indicator member to an alarm position, thus indicating the occurrence of a discontinuity in the segment of the control conductors being monitored. The alarm member may be such that its movement by coil 110 will result in a portion of the member, or other attached structure, being exposed to the view of a technician through an aperture in the indicator cabinet. The exposed portion of the alarm member may be printed red to heighten its visual impact. The initial flow of current through the coil 110 will be shunted to ground via capacitor 112 until the capacitor is fully charged. After this, the resistor 114 will be the only path to ground through the coil 110. This value of resistor 114 will be chosen such that the flow of current through the coil 110 will be minimal.

It will be appreciated that the use of the magnetically actuated mechanical indicator is advantageous in that, should power to the entire system be lost, the alarm indication will not be eradicated. Additionally, should the discontinuity in the control conductors be only intermittent, the alarm indication will not be eradicated with the a.c. loop resumes its continuity since, at that time, the transistor 104 wil be switched off, but no reset current will be applied to the coil 110.

The magnetic latch may be reset only by actuation of a manual reset switch 116 which will close contacts 118 and 120. A reset current will be provided to coil 110 in a direction opposite to that of the current supplied to the coil 110 through transistor 104, with the result that the alarm member will be returned to its non-alarm position.

The following components have been found to provide successful operation in the circuit illustrated in FIGS. 1-4:

| Component Numeral | Component or Component Value |
|---|---|
| 28, 30 | 10 microfarads |
| 32 | primary-3 to 4 turns #18 wire secondary-50 turns #30 wire |
| 56,58 | 1N 5243 |
| 52 | 1500 picofarads |
| 54 | 4700 picofarads |
| 70,76 | 100 picofarads |
| 64,68 | 10 megohms |
| 62,86,88 | 1K ohms |
| 60 | MC 14007 |
| Vcc | 14 volts |
| 78,80,92 | 1N4148 |
| 82 | 100 picofarads |
| 90 | 3.3 megohms |
| 72,74 | MC 3302 |
| 84, 106,114 | 22K ohms |
| 96 | 2.7 megohms |
| 94 | 3.3 microfarads |
| 98, 102 | 6.8K ohms |
| 100 | 2.2K ohms |
| 108 | 8.2K ohms |
| 104 | 2N2907 |
| 112 | 47 microfarads |
| 110 | BHG 2 1T-12-R/W two color magnetic latch indicator available from Minelco Division of General Time, Thomaston, Connecticut. |

It will be appreciated that many variations in the continuity monitor and indicator circuit of the present invention may be made which will come within the scope of the present invention. This monitor and indicator circuit may be used in various types of systems employing control conductors. For instance, although the load 22 is shown attached across the last segment of the train, it will be appreciated that this load may just as well be included within the d.c. current generator 24 and a simple conductor substituted in its place. Also it will be appreciated that the present invention may be used with control systems applying a.c. control current through the control conductors. The important factor in such an arrangement is to utilize an oscillator circuit having a frequency substantially higher than that of the control current. The capacitor means bridging each end of the monitored segment are chosen to provide a small impedance at the oscillator circuit frequency while simulating an open circuit for purposes of the a.c. control current.

While the form of apparatus herein described constitutes a preferred embodiment of the present invention, it is to be understood that the invention is not limited to this precise form of apparatus, and that changes may be made therein without departing from the scope of the invention.

What is claimed is:

1. A continuity monitor and indicator circuit for monitoring the continuity of a segment of a pair of control conductors along which a control current flows, comprising:

a capacitor means at each end of said segment of said control conductors bridging said conductors and providing an a.c. electrical path therebetween, a transformer having its secondary winding connected in series with one of said control conductors in said segment, oscillator means including a tank circuit connected to the primary winding of said transformer and having an oscillator output, said tank circuit being such that said oscillator output is in a first oscillatory state when a closed a.c. electrical loop is provided by the secondary winding of said transformer, the control conductor segment, and the bridging capacitor means, and said oscillator output is in a second oscillatory state when no such closed a.c. electrical loop is formed, detector means, responsive to said oscillator output, for detecting when said second oscillatory state is provided at said oscillator output and for providing a detector output in response thereto, delay means, responsive to said detector means, for providing an alarm output upon receipt for a predetermined period of time of a detector output and indicator means, responsive to said alarm output for providing an alarm indication, whereby interruption in the continuity of said closed a.c. electrical loop is detected and an alarm indication provided in response thereto.

2. The continuity monitor and indicator circuit of claim 1 in which said oscillator means is detuned by said tank circuit when said closed a.c. electrical loop is formed such that said oscillator means does not provide an oscillating signal on said oscillator output in its first oscillatory state, and in which said oscillator means provides an oscillating signal on said oscillator output in a second oscillatory state when said closed a.c. electrical loop is broken.

3. The continuity monitor and indicator circuit of claim 2 in which said detector means includes a comparator, having a first input responsive to a reference potential and a second input responsive to said oscillator output, to provide a detector output when the output from said oscillator means exceeds said reference potential.

4. The continuity monitor and indicator circuit of claim 3 in which said delay means includes a resistor and a capacitor connected to provide an R-C time constant determinative of said predetermined period of time.

5. The continuity monitor and indicator circuit of claim 1 in which said alarm means comprises a bi-directional magnetically actuatable visual alarm having an actuation coil for receiving current, the direction of which determines the alarm indication state of said alarm means.

6. The continuity monitor and indicator circuit of claim 1 in which said control conductors extend through a plurality of railroad cars in a train and the conductors in each car are coupled to the conductors in adjacent cars through connectors and, further, in which only a single capacitor is placed in each railroad car, bridging the contacts at a first end of each car, whereby the closed a.c. electrical loop includes connectors providing connection of the control conductors to an adjacent railroad car.

7. A continuity monitor and indicator circuit for monitoring the continuity of a segment of a pair of control conductors along which a control current flows, comprising:

capacitor means at each end of said segment of said control conductors bridging said conductors and providing an a.c. electrical path therebetween, a transformer having its secondary winding connected in series with one of said control conductors in said segment, oscillator means including a tank circuit connected to the primary winding of said transformer and having an oscillator output, said tank circuit being such that said oscillator output is in a first oscillatory state when a closed a.c. electrical loop is provided by the secondary winding of said transformer, the control conductor segment, and the bridging capacitor means, and said oscillator ouput is in a second oscillatory state when no such closed a.c. electrical loop is formed, detector circuit means, responsive to said oscillator output for detecting when said second oscillatory state is provided at said oscillator output and for providing an alarm output, and indicator means, responsive to said alarm output, for providing an alarm indication, whereby interruption in the continuity of said closed a.c. electrical loop is detected and indicated.

* * * * *